(12) United States Patent
Liu et al.

(10) Patent No.: US 10,347,501 B2
(45) Date of Patent: Jul. 9, 2019

(54) ENHANCED PATTERNING OF INTEGRATED CIRCUIT LAYER BY TILTED ION IMPLANTATION

(71) Applicant: THE REGENTS OF THE UNIVERSITY OF CALIFORNIA, Oakland, CA (US)

(72) Inventors: Tsu-Jae Liu, Fremont, CA (US); Xi Zhang, Berkeley, CA (US); Peng Zheng, Albany, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 15/798,681

(22) Filed: Oct. 31, 2017

(65) Prior Publication Data

US 2018/0130668 A1 May 10, 2018

Related U.S. Application Data

(63) Continuation of application No. PCT/US2016/030218, filed on Apr. 29, 2016.

(60) Provisional application No. 62/155,903, filed on May 1, 2015.

(51) Int. Cl.
*H01L 21/311* (2006.01)
*H01L 21/308* (2006.01)
*H01L 21/265* (2006.01)

(52) U.S. Cl.
CPC .... *H01L 21/3086* (2013.01); *H01L 21/26506* (2013.01); *H01L 21/26586* (2013.01); *H01L 21/31116* (2013.01)

(58) Field of Classification Search
CPC .......... H01L 21/3086; H01L 21/26586; H01L 21/31116; H01L 21/26506
USPC ........................................................ 438/703
See application file for complete search history.

(56) References Cited

U.S. PATENT DOCUMENTS

| | | | |
|---|---|---|---|
| 6,498,061 B2 | 12/2002 | Divakaruni | |
| 6,960,510 B2 * | 11/2005 | Deshpande | ......... H01L 21/0337 257/E21.038 |
| 6,989,331 B2 * | 1/2006 | Gopinath | .......... H01L 21/31116 257/E21.252 |
| 7,316,978 B2 | 1/2008 | Lee | |

(Continued)

OTHER PUBLICATIONS

Korean Intellectual Property Office (KIPO), International Search Report and Written Opinion dated Jul. 28, 2016, counterpart PCT international application No. PCT/US2016/030218, pp. 1-12, with claims searched, pp. 13-17.

*Primary Examiner* — Vu A Vu
(74) *Attorney, Agent, or Firm* — O'Banion & Ritchey LLP; John P. O'Banion

(57) ABSTRACT

Methods for achieving sub-lithographic feature sizes in an integrated circuit (IC) layer are provided that use ion implantation to enhance or reduce the etch rate of a thin masking layer. The etch rates also can be enhanced or reduced at specific locations through multiple implantation steps. The implantation can be performed at tilted angles to achieve sub-lithographic implanted regions that are self-aligned to pre-existing photoresist or hard-mask features over the masking layer on the surface of a substrate. A higher density of features can be achieved in an IC layer than are present in an overlying masking layer with the use of ion implantation.

19 Claims, 5 Drawing Sheets

(56) References Cited

U.S. PATENT DOCUMENTS

| | | | |
|---|---|---|---|
| 8,187,952 B2* | 5/2012 | Kim | H01L 27/10876 |
| | | | 257/E21.629 |
| 9,299,616 B1* | 3/2016 | Faul | H01L 21/82343 |
| 2004/0164304 A1 | 8/2004 | Magri | |
| 2005/0006347 A1 | 1/2005 | Gopinath | |
| 2012/0018730 A1 | 1/2012 | Kanakasabapathy | |
| 2012/0223418 A1 | 9/2012 | Stowers | |
| 2015/0031210 A1 | 1/2015 | Ban | |

* cited by examiner

ENHANCED PATTERNING OF INTEGRATED CIRCUIT LAYER BY TILTED ION IMPLANTATION

CROSS-REFERENCE TO RELATED APPLICATIONS

This application is a 35 U.S.C. § 111(a) continuation of PCT international application number PCT/US2016/030218 filed on Apr. 29, 2016, incorporated herein by reference in its entirety, which claims priority to, and the benefit of, U.S. provisional patent application Ser. No. 62/155,903 filed on May 1, 2015, incorporated herein by reference in its entirety. Priority is claimed to each of the foregoing applications.

The above-referenced PCT international application was published as PCT International Publication No. WO 2016/179025 on Nov. 10, 2016, which publication is incorporated herein by reference in its entirety.

STATEMENT REGARDING FEDERALLY SPONSORED RESEARCH OR DEVELOPMENT

Not Applicable

INCORPORATION-BY-REFERENCE OF COMPUTER PROGRAM APPENDIX

Not Applicable

BACKGROUND

1. Technical Field

The present technology pertains generally to integrated circuit (IC) manufacturing methods, and more particularly to patterning methods using tilted ion implantation (TII) for achieving sub-lithographic features in a more cost-effective manner than established so-called "multiple-patterning" techniques such as self-aligned double-patterning (SADP) or litho-etch-litho-etch (LELE) schemes.

2. Background

Since the early 1960s, the physical dimensions of integrated-circuit components such as transistors have been scaled down exponentially over time to provide for lower cost per function and increased functional density. Additional benefits of such "technology scaling" include increased circuit operating speed and reduced energy consumed per computing function. The performance and cost advantages of technology scaling have stimulated substantial investments in fabrication technologies to sustain the pace of advancement in IC manufacturing, that is, to continue to increase the number of components per unit area on an IC "chip." As the minimum dimensions of IC components have decreased to be smaller than the wavelength of light that is used in the photolithographic patterning process, new approaches to defining smaller features with higher density have been developed. Although these approaches increase the total process cost, they have been adopted in high-volume IC manufacturing because they enable higher component density which provides for lower cost per transistor and improved IC performance.

An IC comprises multiple layers of patterned material on an underlying substrate. A conventional patterning process involves 4 steps: (1) coating of a light-sensitive organic material called "photoresist" over the IC layer, (2) photolithography, i.e., light exposure through a mask followed by immersion in a chemical developer solution to reproduce the mask pattern in the photoresist layer, (3) selective etch of the IC layer in regions not protected by photoresist, to transfer the pattern from the photoresist layer to the IC layer, and (4) selective removal of the patterned photoresist layer. For patterning IC layers with critical dimensions, an intermediary hard (inorganic) masking layer may be used: the pattern is first transferred from the photoresist to the hard masking layer to form the hard mask; then the pattern of the hard mask is transferred to the IC layer with better etch selectivity. In this case, extra process steps are required to deposit the hard masking layer prior to photoresist coating, to etch the hard masking layer, and to selectively remove the hard mask after it is used to pattern the IC layer, i.e., 7 process steps are needed.

Photolithography uses an exposure (or "printing") system to illuminate the photoresist-coated surface of an IC layer on a substrate (typically comprising a silicon wafer) through a mask. Early ICs were fabricated using contact printers, in which the mask is placed directly in contact with the photoresist layer. The mask can be damaged upon contact, however, resulting in imperfections in the transferred patterns for subsequently processed wafers; also, the accuracy of alignment between the mask features and pre-existing features (i.e. the patterns of lower IC layers) on the wafer, referred to as "overlay", is relatively poor, resulting in reduced IC manufacturing yield. To avoid these problems the proximity printing technique (in which a small gap exists between the mask and the wafer) was developed, but at a tradeoff of degraded optical resolution. Projection exposure systems were developed later to reduce mask costs and to achieve better overlay accuracy by exposing only a portion (one die or an array of dies) of the substrate at a time.

The minimum feature size and feature pitch that a projection exposure system can print is fundamentally limited by the wavelength of the light used. For example, the minimum pitch ($P_{min}$) of features is limited by diffraction and is proportional to the wavelength of light, $\lambda$: $P_{min} = 2k_1 \lambda / n_i \sin \theta$ where $k_1$ is a process factor with a lower limit of 0.25, $\theta$ is the propagation angle of the projection lens system (typically ~70°), and $n_i$ is the lowest index of refraction of the propagation medium. ($P_{min}$ is twice the minimum feature size.) For a state-of-the-art 193 nm water-immersion ($n_i$=1.44) exposure tool, $P_{min}$~90 nm.

Diffraction and interference effects can also result in printed features with rounded corners (whereas the mask features have sharp corners). For example, "blurring" of the photoresist pattern on the wafer produced by the photolithographic process worsens as the size of the features shrinks further below the wavelength of the light, which is 193 nm for the most advanced exposure tools used in high-volume IC manufacturing today. The more complex the shape of a sub-wavelength feature, the more difficult it is to print with good fidelity. For example, patterns that have serifs such as brackets ([), or bends such as in the letter "L," or zig-zags (⌐) are much more difficult to print than straight lines due to more complex diffraction effects. Therefore, for the most advanced chips produced today, IC layer patterns are restricted to comprising only linear features, often with uniform pitch (i.e. uniform spacing).

Due to the low transmittance of blank mask materials and/or the lack of sufficiently high-intensity light sources for wavelengths shorter than 193 nm, the semiconductor industry has resorted to using multiple-patterning techniques to achieve smaller features with higher density within an IC layer without reducing the wavelength of light used for photolithography. Although multiple-patterning techniques allow smaller features with higher density to be achieved, they require additional process steps with significant associated incremental costs.

There are two main multiple-patterning techniques currently used in IC manufacturing. One is referred to as the "double exposure, double etch" or "litho-etch-litho-etch" (LELE) technique that involves two exposure processes and two etch processes. As implied by its name, the LELE technique involves roughly twice the number of processes as the conventional photolithographic process to pattern a single IC layer. In addition, any discrepancies between the first and second pattern exposures such as alignment or magnification errors can lead to undesirable variations in feature size and pitch.

The other main multiple-patterning technique is referred to as "spacer lithography" or "self-aligned double patterning" (SADP). Although SADP eliminates the complication of pattern alignment for the LELE technique, it involves even more processes. The additional cost due to extra lithography or deposition and etch processes associated with multiple-patterning techniques can be substantial.

To address the issue of increasing patterning costs, alternative approaches to defining sub-lithographic features (i.e. smaller than the resolution limit of photolithography) are needed. One example is directed self-assembly (DSA) of a diblock copolymer film: the film is coated onto a wafer with lithographically defined features on its surface, which serve as a guide for the formation of the sub-lithographic features; self-assembly (phase separation) occurs upon heating to form features as small as a few nanometers, depending on the degree of polymerization (number of monomer repeats in the chain) and the block-block interaction parameter. Drawbacks of this technique include a limited range of feature sizes and pitches for a given diblock copolymer material formulation, and feature-edge roughness which does not scale well with the feature size.

Therefore, there remains an urgent need to develop more cost-effective approaches for scaling down the minimum feature size and increasing the density of features in an integrated circuit. The present technology satisfies these needs and is generally an improvement in the art.

BRIEF SUMMARY

Methods for achieving sub-lithographic features and/or doubling the density of features in an IC layer on a substrate are provided. The methods are capable of achieving arbitrarily small feature sizes, self-aligned to pre-existing masking features on the surface of the IC layer formed by photolithography or multiple-patterning techniques.

Tilted ion implantation (TII) processes can be used in conjunction with pre-existing masking features on the surface of an IC layer to form features with smaller dimensions and smaller pitch with fewer processes and at lower cost than would be required using existing multiple-patterning schemes. Essentially, an ion implantation process is used to selectively alter the etch rate of a thin masking layer or an IC layer. Ions are implanted at a tilted angle to achieve implanted regions with a sub-lithographic dimension, self-aligned to pre-existing photoresist or hard-mask features.

The methods not only can be adapted to single patterning schemes but also can be used with multiple patterning schemes. The methods insert an ion-implantation process between lithography and etch processes to produce a "Litho-Implant-Etch" scheme. For example, the technology can be adapted to the LELE patterning scheme to provide a "Litho-Implant-Etch-Litho-Implant-Etch" process. It is apparent to those of ordinary skill in the art that the implantation process can be incorporated into other patterning schemes as well.

The parameters of the ion implantation process (including the selection of ion species, acceleration energy, dose, tilt angle and substrate temperature) to be applied can provide control over the nature of the change in etch rate. For example, the etch rate of implanted regions can be enhanced due to structural damage, e.g. the wet etch rate of silicon dioxide ($SiO_2$) increases with argon ion implant dose above a certain threshold level. As another example, the etch rate of implanted regions can be reduced with the use of O or N as the implantation species forming oxides or nitrides. In one embodiment, in situ heating can be used to promote oxidation or nitridation to improve resistance to etching.

The etch rates also can be enhanced or reduced at specific locations through multiple implant steps. Accordingly, the doubly implanted regions will etch at a greater (or lesser) rate than the singly implanted regions and the triply implanted regions will etch at a greater (or lesser) rate than both the singly and doubly implanted regions. The implant dose can be decreased or increased by adjusting the implantation time and ion beam current.

In one preferred embodiment, the IC layer to be patterned is coated with at least one hard masking layer. Next, a photoresist is coated onto the surface of the hard masking layer. Then, photolithography is used to pattern the photoresist layer. Ion implantation is then performed at a positive tilt angle and also at a negative tilt angle to selectively damage regions of the hard masking layer, leaving the central region between the photoresist features undamaged due to the shadowing effect. The implanted regions are self-aligned with the photoresist features. Next, portions of the hard masking layer which are damaged by the ion implantation are etched away more rapidly than the undamaged portions, resulting in a patterned hard mask. Then an etch process is used to transfer the pattern of the hard mask to the IC layer. (The patterned photoresist layer may be removed either before or after this process.) Afterwards, the hard mask is selectively removed.

It should be noted that the hard masking layer may not be necessary. In another embodiment, the IC layer itself can be selectively implanted to allow it to be patterned directly without a hard mask in place during the etching process.

Appropriate selection of the parameter values for the ion implantation process will allow patterning of a $SiO_2$ masking layer, for example, with features of average pitch equal to one half of the pitch of pre-existing masking features. Control over the etching characteristics of the implanted masking layer is provided by selection of the ion species, implant tilt angle, ion acceleration energy, and total implanted ion dose.

Accordingly, double-patterning by tilted ion implantation requires fewer and less expensive processes than that required by established multiple-patterning techniques and hence is expected to be much more cost-effective. For example, the tilted ion implantation technique is a lower-cost alternative to the self-aligned double patterning (SADP) scheme for pitch halving.

According to one aspect of the technology, a method incorporating ion implantation is used to enhance or retard the etch rate of a thin masking layer, and to perform implants at a tilted angle to achieve sub-lithographic implanted regions that are self-aligned to pre-existing photoresist or hard-mask features over the masking layer on the surface of an IC layer.

Another aspect of the technology is to provide a relatively simple process as compared to lithography, deposition and etch processes that require steps to pre-coat, pre-bake, pre-clean, or post-clean the substrate.

A further aspect of the technology is to provide an enhanced patterning scheme that is simpler and has lower overall cost than existing multiple-patterning techniques.

Another aspect of the technology is to provide an enhanced patterning scheme that is easy to implement in high-volume manufacturing facilities.

Further aspects of the technology described herein will be brought out in the following portions of the specification, wherein the detailed description is for the purpose of fully disclosing preferred embodiments of the technology without placing limitations thereon.

BRIEF DESCRIPTION OF THE SEVERAL VIEWS OF THE DRAWING(S)

The technology described herein will be more fully understood by reference to the following drawings which are for illustrative purposes only:

DETAILED DESCRIPTION

Referring more specifically to the drawings, for illustrative purposes, embodiments of the methods and resulting structures are generally shown. Several embodiments of the technology are described generally in FIG. 1A through FIG. 3C to illustrate the methods and structures. It will be appreciated that the methods may vary as to the specific steps and their sequence, and the structural details, without departing from the basic concepts as disclosed herein. The embodiments are merely exemplary of the sequence of steps. The steps may occur in any order such that the goals of the claimed technology are achieved.

Turning now to FIG. 1A through FIG. 1H, one preferred embodiment of a sub-lithographic patterning method 10 incorporating an ion implantation process according to the technology is generally described. The general concept is the use of ion implantation to enhance the etch rate of a thin masking layer and to perform the implantation at tilted angles to achieve sub-lithographic implanted regions that are self-aligned to pre-existing photoresist or hard-mask features over the masking layer on the surface of a substrate. Tilted ion implantation (TII) can be used in conjunction with pre-existing masking features on the surface of a wafer substrate to form features with smaller dimensions and smaller pitch than can be achieved with conventional methods. This method has been shown to be capable of patterning feature sizes below 10 nm, in a self-aligned manner. Thus, the TII-enhanced patterning method can extend IC technology scaling to sub-20 nm minimum pitch.

Figure 1A:
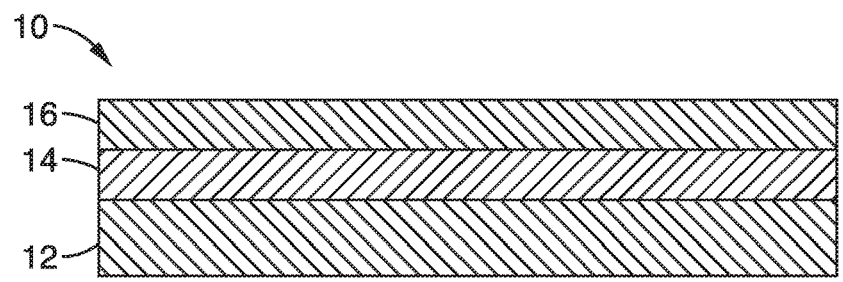
FIG. 1A is a schematic cross-section of a substrate and an IC layer to be patterned coated with a hard masking layer.

In the embodiment of the method 10 illustrated schematically in FIG. 1A to FIG. 1H, a laminate is initially provided that has an underlying substrate 12 with an intermediate integrated circuit (IC) layer 14 to be patterned and a top hard masking layer 16, as shown in FIG. 1A. Suitable materials for the hard masking layer include amorphous silicon (a-Si), amorphous carbon (a-C), silicon-carbon-oxide, polycrystalline silicon, silicon nitride ($SiN_x$ or $Si_3N_4$), silicon oxynitride ($SiO_xN_y$), and silicon dioxide ($SiO_2$).

Figure 1B:
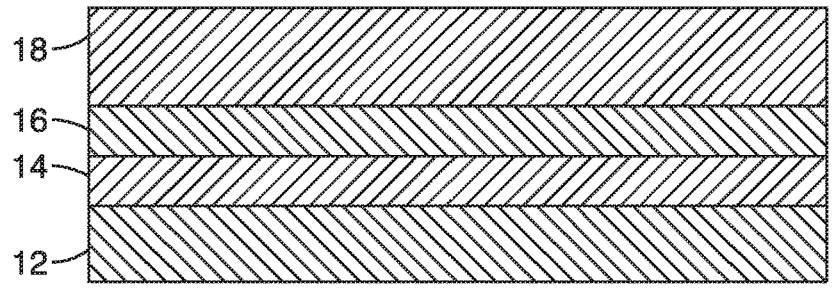
FIG. 1B is a schematic cross-section showing a layer of light-sensitive "photoresist" coated onto the hard masking layer of the laminate of FIG. 1A.
Figure 1C:
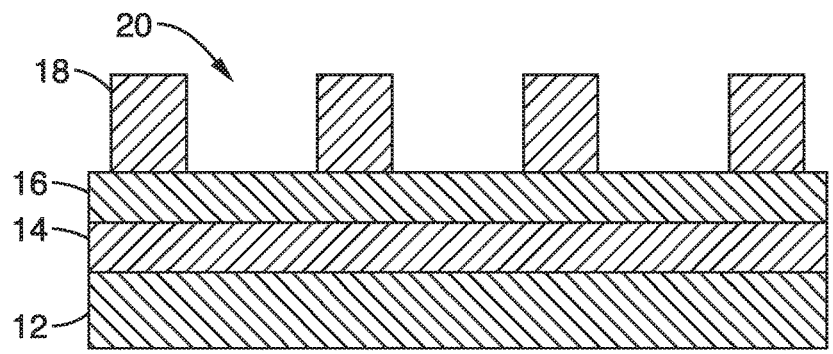
FIG. 1C is a schematic cross-section showing the patterning of the photoresist layer by the application of photolithography.

Next, as shown in FIG. 1B, a photoresist layer 18 is coated over the hard masking layer 16. Conventional photoresist materials and coating schemes are preferred. Then, as shown in FIG. 1C, a photolithography process is used to form features in the photoresist layer 18. The photolithography process produces a pattern of photoresist features 18 and spaces 20 where the hard masking layer 16 is exposed. The photolithography process includes light exposure through a mask, followed by immersion in a chemical developer solution to remove photoresist in regions exposed to light. Often the printed photoresist features are "trimmed" to become narrower than the lithographic resolution limit.

Figure 1D:
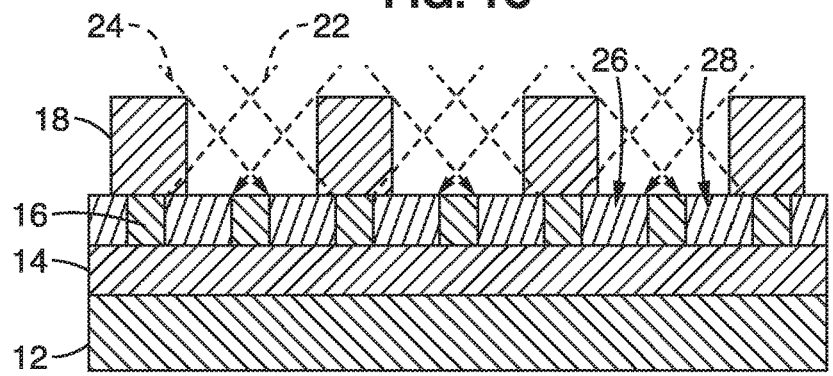
FIG. 1D is a schematic cross-section showing that ion implantation is performed at positive and negative tilt angles to selectively damage regions of the hard masking layer, leaving the central region between the photoresist features undamaged due to the shadowing effect.

As shown in FIG. 1D, ion implantation is performed at positive and at negative tilt angles (dashed lines). In this illustration, a first ion implant 22 is performed at a positive tilt angle to selectively implant portions 26 of the hard masking layer 16 to the left of the blocking photoresist features, and a second implant 24 is performed at a negative tilt angle to selectively implant portions 28 of the hard masking layer 16 to the right of the blocking photoresist features. The ion implantation selectively implants regions of the hard masking layer 16, leaving the central regions in the spaces between the photoresist features unimplanted due to the shadowing effect.

The etch rate of the hard masking layer 16 is either enhanced or retarded in the implanted regions. For example, regions of a $SiO_2$ hard masking layer implanted with a sufficiently high dose of ions such as Argon ($Ar^+$) can be etched away at a higher rate as compared with regions that are not implanted. On the other hand, regions of a hard masking layer 16 implanted with doses of ions such as oxygen or nitrogen can be etched away at a lower rate as compared with regions that are not implanted. The etching rate may also depend on the implanted ion dose.

Figure 1E:
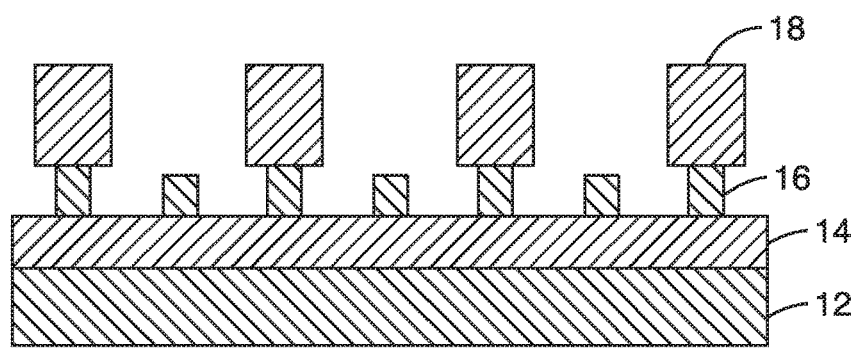
FIG. 1E is a schematic cross-section showing the results of an etch process that is used to remove regions of the hard masking layer in regions that are not protected by the etch-resistant photoresist. Regions of the hard masking layer which are damaged are etched away more rapidly than undamaged regions.

As illustrated in FIG. 1E, portions of the hard masking layer which were implanted are selectively removed by an etch process. For example, the implanted / damaged regions 26, 28 of the hard masking layer 16 can be selectively removed in dilute hydrofluoric acid (DHF) solution, resulting in a patterned $SiO_2$ masking layer 16 with features of average pitch equal to one-half the average pitch of the photoresist features 18. It has been demonstrated that the rate at which silicon-dioxide ($SiO_2$) is etched in a hydrofluoric acid solution can be enhanced by up to nine times by implantation-induced damage above a threshold level of approximately $1 \times 10^{22}/cm^3$.

Figure 1F:
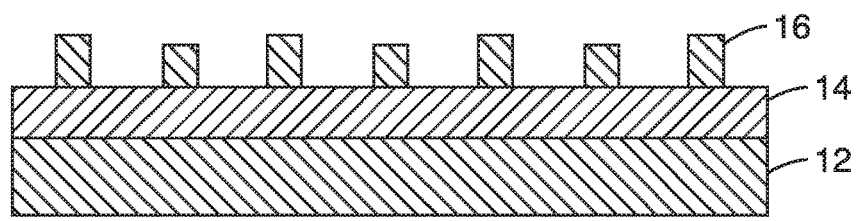
FIG. 1F is a schematic cross-section showing the selective removal of the photoresist mask.

Then, as shown in FIG. 1F, the patterned photoresist layer 18 is selectively removed leaving the patterned hard masking layer 16 over exposed portions of the IC layer 14.

Figure 1G:
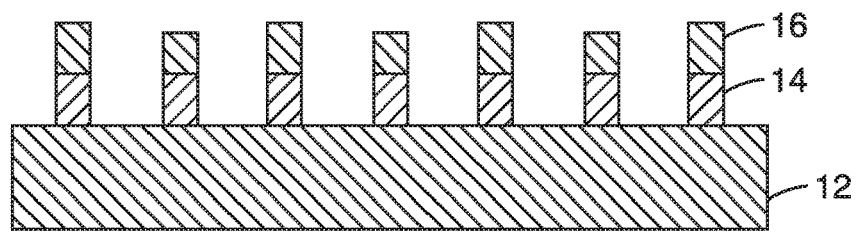
FIG. 1G is a schematic cross-section showing the results of an etch process that is used to transfer the pattern of the hard mask to the IC layer. This may include a second ion implantation step.

Next, as shown in FIG. 1G an etch process is used to effectively transfer the pattern of the hard mask 16 to the IC layer 14.

Figure 1H:
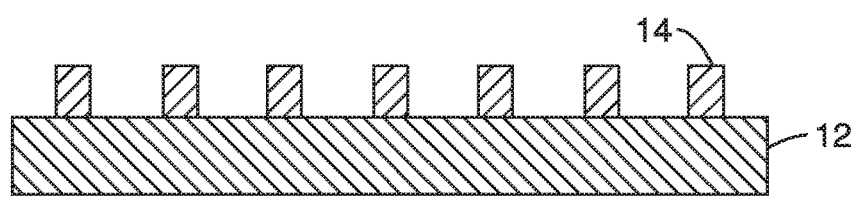
FIG. 1H is a schematic cross-section showing the selective removal of the hard mask, and the remaining patterned IC layer.

Finally, the hard mask 16 is selectively removed, leaving the patterned IC layer 14 on the substrate 12 as shown in FIG. 1H.

In comparison with conventional (photolithography+hard mask) patterning processes, this new enhanced patterning approach only requires one additional process, i.e. tilted ion implantation. The overall approach inserts an ion-implantation process between the lithography and etching processes. It should be noted that ion implantation is a relatively simple process as compared to lithography, deposition and etch processes, since it does not require the steps of pre-coating, pre-cleaning, or pre-baking of the substrate.

Ion implantation is a standard technique used in IC manufacturing to introduce atoms in precise amounts (doses in the range from $10^{11}/cm^2$ to $10^{16}/cm^2$) into the surface region of a substrate, over a range of depths ("projected range" determined by the ion acceleration energy, which can range from <1 keV to 60 keV in common implanters).

Ion implantation is also a low-temperature process that is compatible with a wide selection of materials such as photoresist, $SiO_2$, polycrystalline silicon, $Si_3N_4$, metals for the pre-existing mask features 18.

By leveraging the shadowing effect of pre-existing masking features (defined by conventional lithography or by multiple-patterning techniques), features smaller than the lithographic resolution limit can be achieved, and the density of features can be doubled. Furthermore, the final feature sizes can be easily fine-tuned by adjusting the implantation tilt angles. The implantation tilt angle can be readily adjusted in the range from −60° to +60°.

It can be appreciated by one of ordinary skill in the art that there are many variations of the patterning approach described in relation to FIG. 1A to FIG. 1H that can be adapted to produce patterns of desired dimensions in an IC layer. In addition, the implantation-enhanced patterning approach can be used together with other multiple-patterning techniques to achieve even higher feature densities (<45 nm pitch).

In one embodiment, smaller implant tilt angles and doses below the threshold level can be used, such that the entirety of the regions between the pre-existing mask features are implanted but the central regions receive a double dose which exceeds the threshold level. The resulting sub-lithographic trench features after an etch process correspond to these central (doubly implanted) regions. However, the feature density is not increased with this approach.

In other embodiments, the hard masking layer 16 may not be necessary, i.e. the IC layer itself can be selectively implanted to allow it to be patterned directly without a hard mask in place during the etch process. In a similar embodiment, the photoresist layer 18 is applied directly over the IC layer 14 and photoresist features are used to directly block portions of the IC layer from being implanted.

Figure 2A:
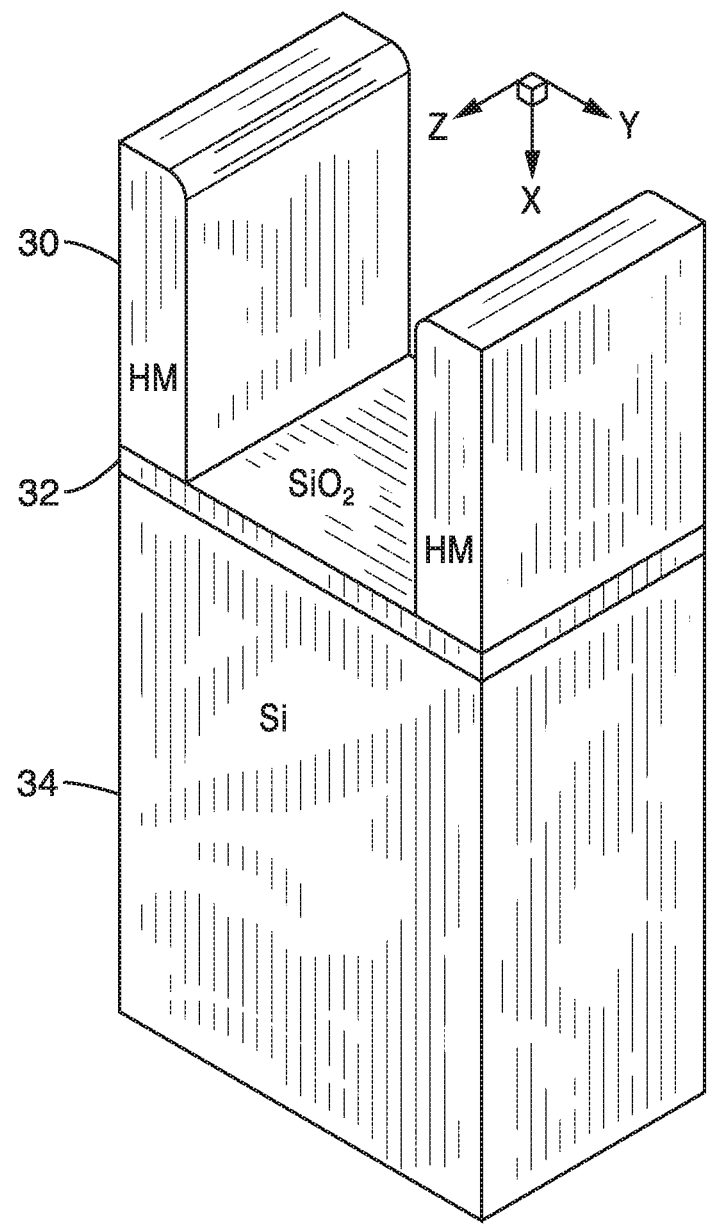
FIG. 2A is a schematic isometric view of the 3-D structure used for Monte-Carlo ion implantation simulations reflecting one embodiment of the technology.
Figure 2B:
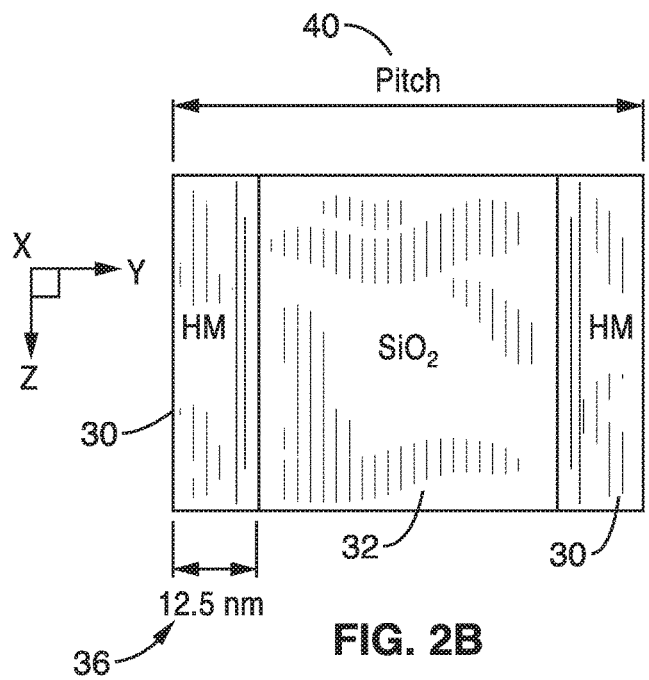
FIG. 2B is a schematic plan view of the structure used for Monte-Carlo ion implantation simulations and structural evaluation.
Figure 2C:
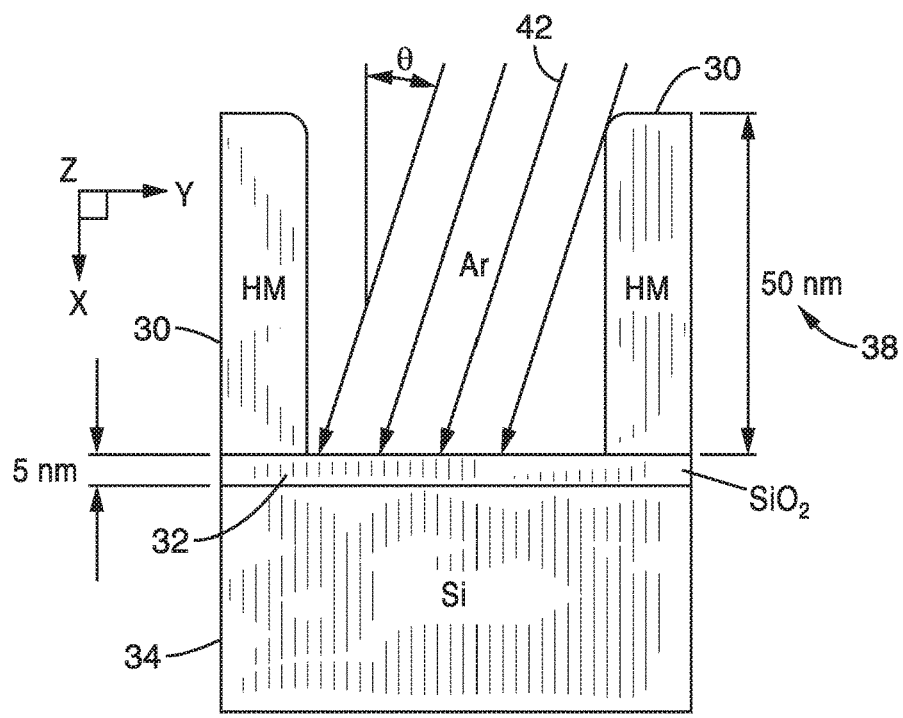
FIG. 2C is a schematic cross-sectional view of the structure used for Monte-Carlo ion implantation simulations and structural evaluation.

In another variation, the hard masking layer 16 is patterned using a photoresist mask 18 and etch process, to form a hard mask 16 over an IC layer or yet another hard masking layer overlying the IC layer. After the photoresist mask is selectively removed, the hard mask 16 is used to block ion implantation of selected regions of the exposed layer underlying it. This approach is illustrated in FIG. 2A through FIG. 2C.

In still another variation, two hard masking layers are deposited over the IC layer and the photoresist layer is applied to the top hard masking layer. The patterned photoresist layer is used to block ion implantation of portions of the top hard masking layer, similar to that shown in FIG. 1D. After etching of the top hard masking layer and removal of the photoresist layer, the top patterned hard mask is then used to block ion implantation of sections of the lower hard masking layer to produce a pattern with even smaller features in the lower hard masking layer. After etching the lower hard masking layer, the features of the lower hard mask are transferred into the underlying IC layer by etching, in this embodiment.

In another embodiment, rather than enhancing etch rate, the ion implantation can modify the surface to reduce the etch rate. For example, implantation of oxygen or nitrogen can be used to modify the surface material composition of a conductive IC layer. In-situ heating, which is available with some implanters, can facilitate this process. In this embodiment, the regions of the IC layer that are subsequently selectively etched would correspond to the non-implanted regions. Both types of implantation can also be used to provide control over the etching rate and specific locations.

The etch rate of $SiO_2$ has been shown to have a non-linear dependence on the ion implantation dose. In general, there exists a threshold dose that must be exceeded to see an effect on the etch rate. In other words, if the dose ($D_1$) is greater than the threshold ($D_T$) then the implanted regions will etch much more quickly or slowly.

Multiple implants also can be used to exceed the threshold dose to either enhance or reduce the etch rate. For example, if a first dose ($D_1$) is less than the threshold ($D_T$) and a second dose ($D_2$) is less than the threshold ($D_T$), then the combination of doses may exceed the threshold dose and the doubly implanted regions may etch much more quickly over the regions that have not been implanted. Likewise, for ion implantation that will reduce the etch rate, if $D_1+D_2>D_T$ then the doubly implanted regions will etch much more slowly. Minimum feature size and feature placement can be adjusted by selection of the tilt angles for the $D_1$ implant and $D_2$ implant.

Accordingly, a lower-cost patterning approach is provided for achieving sub-lithographic features and/or doubling the density of features. The methods are capable of achieving arbitrarily small feature sizes that are self-aligned to pre-existing masking features formed by lithography or multiple-patterning techniques on the surface of an IC layer.

The technology may be better understood with reference to the accompanying examples, which are intended for purposes of illustration only and should not be construed as in any sense limiting the scope of the present technology as defined in the claims appended hereto.

EXAMPLE 1

In order to investigate the resolution limit of the methods of the present technology, ion implantation simulations of the method with the structure of FIG. 2A through FIG. 2C were performed. In these simulations, a single tilted argon ion ($Ar^+$) implant was used to define sub-lithographic trenches in the surface of a Si wafer, using amorphous silicon (a-Si) for the pre-existing hard masking features 30 and 5 nm-thick $SiO_2$ for the thin oxide masking layer 32. The hard mask 30 had features with a width 36 of 12.5 nm and a height 38 of 50 nm and a feature pitch 40 as seen in the top view of FIG. 2B and the side view of FIG. 2C.

As shown in FIG. 2A to FIG. 2C, the simulated structure comprises the thin oxide layer 32 formed over the substrate 34 and a patterned a-Si hard mask (HM) 30 with perfectly linear features formed over the oxide layer 32.

The resolution limit of the tilted ion implantation patterning method was systematically investigated via Monte Carlo process simulations using the technology computer-aided design (TOAD) software package Sentaurus to obtain a three-dimensional damage profile resulting from tilted $Ar^+$ ion implantation 42 illustrated schematically in FIG. 2C. The ion acceleration energy and dose were adjusted to achieve the same projected range and peak damage concentration for each tilt angle, based on simulations using the computer program Stopping and Range of Ions in Matter (SRIM).

The impact of variations in hard mask corner radius on the average size and latent line-edge roughness (LER) of the implanted oxide region was also evaluated. It was observed that a very small feature (~16 nm-wide implanted oxide region, in this case) can be defined by tilted ion implantation and that the LER introduced by implantation is relatively small and insensitive to variations in hard mask corner radius.

Different feature sizes can be achieved simply by using different implant tilt angles. The impact of implant tilt angle (θ) on the latent LER of the implanted oxide region was evaluated. Due to increased lateral implant straggle, LER increases with the tilt angle. For θ<30°, lateral straggle is not anticipated to limit the resolution of the TII patterning technique.

The effect of 15° tilted, 1.5 keV $Ar^+$ implantation on the etch rate of a 5 nm-thick thermally grown $SiO_2$ layer was investigated experimentally for three different $Ar^+$ implant 42 doses: 0 (no implant), $2\times10^{14}$ cm$^{-2}$ and $3\times10^{14}$ cm$^{-2}$. It was found that the $SiO_2$ etch rate is significantly enhanced by ion implantation and increases with implant dose. The etch rate of $SiO_2$ for an implant dose of $3\times10^{14}$ cm$^{-2}$ was up to 9 times faster than observed with the unimplanted $SiO_2$. A comparison of the measured etch-rate profiles with SRIM-simulated damage profiles indicated that the etch rate was well correlated with the ion implant-induced structural damage.

EXAMPLE 2

To prove the concept of the tilted ion implantation methods, an experiment was conducted with tilted ion implantation 42 at a single angle similar to that shown schematically in FIG. 2C. A layer of photoresist patterned into lines and spaces was formed using conventional lithography on the surface of a silicon wafer coated with a thin (20 nm-thick) $SiO_2$ hard masking layer. Argon ion ($Ar^+$) implantation (dose=$7.0\times10^{13}$ cm$^{-2}$, energy=13.8 keV) was then performed at a single tilt angle of 41° to selectively damage the $SiO_2$ in regions that are not shadow masked by the patterned photoresist. Afterwards a sample of the wafer was dipped in dilute buffered-HF solution to selectively remove the implanted regions of the $SiO_2$ hard mask layer without attacking the photoresist. Subsequently the sample was subjected to a silicon etch process. Due to the relatively poor selectivity of this particular process (<10:1 Si:SiO2 etch-rate ratio), the exposed $SiO_2$ was eventually etched away so that the Si was etched everywhere between the photoresist lines. Nevertheless, sub-lithographic features (trenches in the Si) corresponding to the implanted regions between the photoresist lines could be distinguished by cross-sectional scanning electron microscopy (XSEM).

EXAMPLE 3

Figures 3A, 3B, 3C:
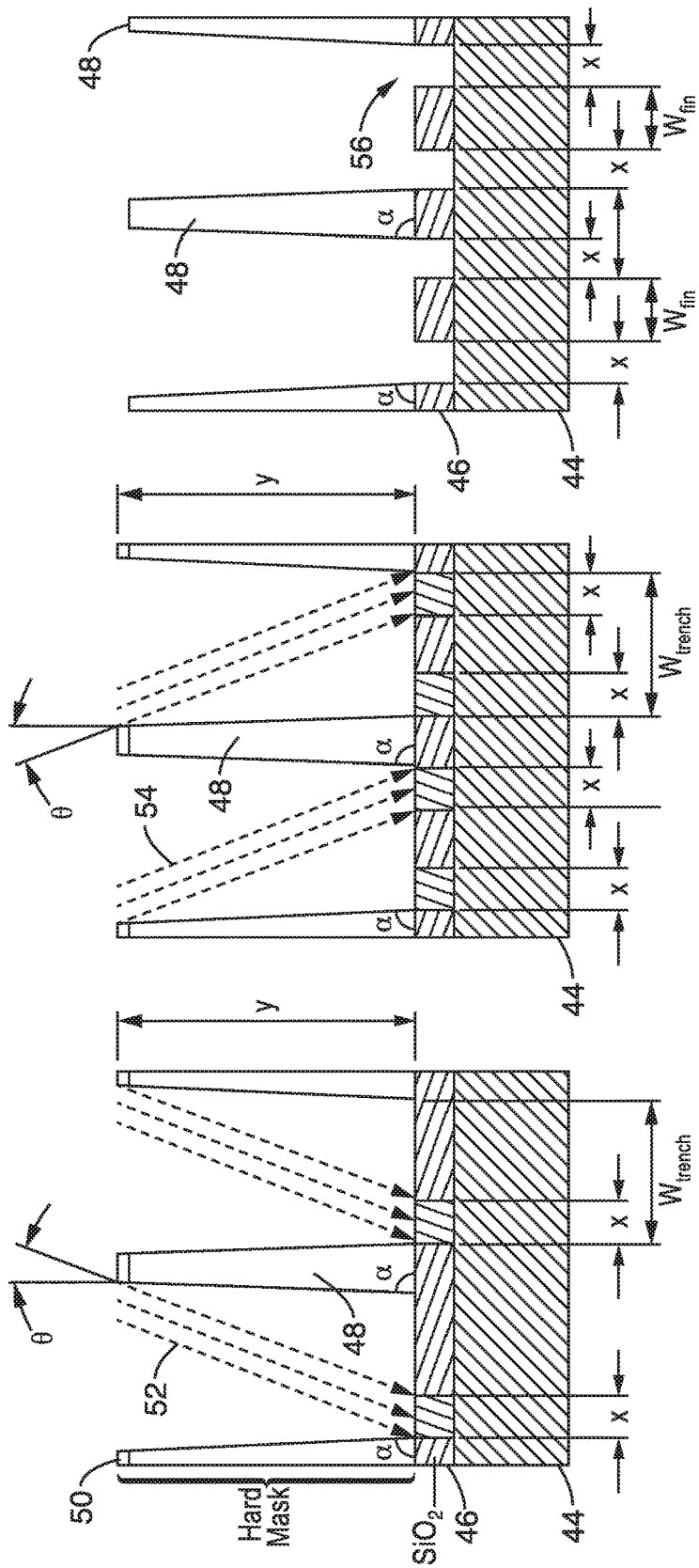
FIG. 3A is a schematic cross-section of a wafer substrate with pre-existing masking features over a thin masking layer illustrating one embodiment of the enhanced patterning approach wherein a first implant is performed at a positive tilt angle to selectively damage portions of the masking layer to the left of the blocking hard-mask features.
FIG. 3B is a schematic cross-section of the structure of FIG. 3A illustrating a second implant that is performed at a negative tilt angle to selectively damage portions of the masking layer to the right of the blocking hard-mask features.
FIG. 3C is a schematic cross-section of the structure of FIG. 3B illustrating that the implanted regions of the masking layer are selectively removed in dilute hydrofluoric acid (DHF) solution.

To further demonstrate the methods of the present technology, an amorphous-silicon hard masking layer 48 was prepared and patterned with the aid of a thin oxide etch-stop layer 50, using a self-aligned double patterning (SADP) process, over a base silicon layer 44 coated with a $SiO_2$ masking layer 46 as seen in FIG. 3A through FIG. 3C. The resulting structure was then used for various tests.

In an initial test to demonstrate the feasibility of achieving sub-lithographic features, a 15° tilted $Ar^+$ implantation was performed. Afterwards the structure was subjected to a dilute-HF etch followed by a silicon reactive ion etch (RIE) to allow the implanted regions to be easily distinguished under a scanning electron microscope (SEM). Cross-sectional SEM images revealed that tilted ion implantation was effective for achieving sub-lithographic features, down to a width of approximately 45 nm, in this initial experiment.

In a second test to demonstrate the feasibility of pitch-halving, double tilted $Ar^+$ implantation with 3.0 keV acceleration energy and $3\times10^{14}$ cm$^{-2}$ dose was performed on another sample. A first ion implantation 52 was performed at a positive tilt angle (+15°) to selectively damage portions of the $SiO_2$ masking layer 46 to the left of the blocking hard-mask features 48 as shown in FIG. 3A.

A second ion implantation 54 was performed at a negative tilt angle) (−15°) to selectively damage portions of the oxide layer 46 to the right of the blocking hard-mask features 48 as shown in FIG. 3B. Regions 56 of the $SiO_2$ masking layer that were implanted were selectively removed in dilute hydrofluoric acid (HF) solution, resulting in a patterned $SiO_2$ hard mask 46 with features of average pitch equal to one-half the pitch of the a-Si hard-mask features 48 as shown in FIG. 3C. Considering that the distance between a-Si hard mask features was ~64 nm, the effective (local) half-pitch of the etched silicon features was ~21 nm.

Ideally, the width of each implanted region (x) of the $SiO_2$ masking layer 46 shown in FIG. 3A to FIG. 3C can be determined by the equation $x \cong W_{trench} - y(\tan \theta - \cot \alpha)$, and the width of each non-implanted region ($W_{fin}$) can be determined by the equation $W_{fin} \cong 2y(\tan \theta - \cot \alpha) - W_{trench}$. In these equations, $W_{trench}$ the base spacing between the a-Si hard mask features 48, $\theta$ is the ion implant tilt angle, and y and $\alpha$ are the hard mask height and sidewall angle values respectively as illustrated in FIG. 3A to FIG. 3C.

From the description herein, it will be appreciated that that the present disclosure encompasses multiple embodiments which include, but are not limited to, the following:

1. A method of achieving sub-lithographic feature sizes in an integrated circuit (IC) layer comprising: (a) implanting ions into a hard masking layer overlying an integrated circuit layer with tilted ion implantation; (b) etching the hard masking layer with implanted regions to remove regions of the masking layer and form a patterned hard masking layer; and (c) using the patterned hard masking layer as a mask to pattern the integrated circuit layer.

2. The method of any preceding embodiment, wherein the hard masking layer is a material selected from the group of materials consisting of amorphous silicon (a-Si), amorphous carbon (a-C), silicon-carbon-oxide, polycrystalline silicon, silicon nitride (SiNx or $Si_3N_4$), silicon oxynitride (SiOxNy), and silicon dioxide ($SiO_2$).

3. The method of any preceding embodiment, wherein the ion implantation comprises: performing ion implantation at a positive tilt angle; and performing ion implantation at a negative tilt angle to selectively damage regions of the hard masking layer, wherein regions between photoresist features remain undamaged due to shadowing effects.

4. The method of any preceding embodiment: wherein the ions used for ion implantation of the hard masking layer are ions of argon ($Ar^+$); and wherein regions of the hard masking layer that are implanted with ions are etched away at an increased rate than non-implanted regions.

5. The method of any preceding embodiment: wherein the ions used for ion implantation of the hard masking layer are ions selected from the group of ions consisting of oxygen and nitrogen; and wherein regions of the hard masking layer that are implanted with ions are etched away at a reduced rate than non-implanted regions.

6. The method of any preceding embodiment, further comprising: applying a photoresist layer on the hard masking layer; printing features in the photoresist layer exposing sections of the hard masking layer with photolithography to produce a patterned photoresist layer; implanting ions into portions of the hard masking layer not blocked by the patterned photoresist layer; and etching away implanted portions of the hard mask layer.

7. The method of any preceding embodiment, further comprising coupling the integrated circuit layer to a base substrate.

8. A method for patterning a semiconductor layer, the method comprising: (a) forming an oxide layer on a semiconductor layer to be patterned; (b) coating a hard masking layer on the oxide layer; (c) performing ion implantation to selected regions of the hard masking layer; (d) etching the hard masking layer to produce a patterned hard masking layer with sections of exposed oxide layer; (e) removing the sections of exposed oxide layer; (f) patterning the semiconductor layer with the pattern of the hard masking and oxide layers; and (g) removing patterned hard mask and oxide layers from the patterned semiconductor layer; (h) wherein implanted regions of the hard masking layer etch at a different rate than non-implanted regions of the masking layer.

9. The method of any preceding embodiment, further comprising coupling the semiconductor layer to a base substrate.

10. The method of any preceding embodiment, further comprising: performing ion implantation to selected sections of the exposed oxide layer through the pattern of the hard masking layer; wherein implanted regions of the oxide layer etch at a different rate than non-implanted portions of the oxide layer.

11. The method of any preceding embodiment: wherein the ions used for ion implantation of the hard masking layer and oxide layer are ions of argon ($Ar^+$); and wherein regions of the hard masking layer and oxide layer that are implanted with ions are etched away at an increased rate than non-implanted regions.

12. The method of any preceding embodiment: wherein the ions used for ion implantation of the hard masking layer and oxide layer are ions selected from the group of ions consisting of oxygen and nitrogen; and wherein regions of the hard masking layer and oxide layer that are implanted with ions are etched away at a reduced rate than non-implanted regions.

13. The method of any preceding embodiment, wherein the hard masking layer is a material selected from the group of materials consisting of amorphous silicon (a-Si), $SiO_2$, polycrystalline silicon and $Si_3N_4$.

14. The method of any preceding embodiment, further comprising: applying a photoresist layer on the hard masking layer; printing features in the photoresist layer exposing sections of the hard masking layer with photolithography to produce a patterned photoresist layer; and implanting ions into portions of the hard masking layer not blocked by the patterned photoresist layer; and etching the hard masking layer.

15. A method for patterning integrated circuits, the method comprising: (a) forming an oxide layer on an integrated circuit (IC) layer to be patterned; (b) applying a hard masking layer to the formed oxide layer; (c) coating a photoresist layer onto the hard masking layer; (d) printing features in the photoresist layer exposing regions of the hard masking layer with photolithography; (e) selectively implanting regions of the exposed hard masking layer with ion implantation; (f) etching the hard masking layer exposing sections of the oxide layer, wherein portions of the hard mask layer that are implanted by ion implantation are etched away at a different rate than portions that are not implanted; (g) removing the photoresist layer from the etched hard masking layer; (h) performing ion implantation to selected sections of the exposed oxide layer not blocked by the etched hard masking layer; (i) etching the oxide layer, wherein portions of the oxide layer that are implanted by ion implantation are etched away at a different rate than portions that are not implanted; (j) patterning the integrated circuit layer with the pattern of the etched oxide layer; and (k) selectively removing the hard masking and oxide layers from the patterned integrated circuit layer.

16. The method of any preceding embodiment, further comprising coupling the integrated circuit layer to a base substrate.

17. The method of any preceding embodiment, wherein the hard masking layer is a material selected from the group of materials consisting of amorphous silicon (a-Si), amorphous carbon (a-C), silicon-carbon-oxide, polycrystalline silicon, silicon nitride (SiNx or $Si_3N_4$), silicon oxynitride (SiOxNy), and silicon dioxide ($SiO_2$) and said oxide layer is a silicon oxide.

18. The method of any preceding embodiment: wherein the ions used for ion implantation of the hard masking layer or oxide layer are ions of argon (Ar$^+$); and wherein regions of the hard masking layer and oxide layer that are implanted with ions are etched away at an increased rate than non-implanted regions.

19. The method of any preceding embodiment: wherein the ions used for ion implantation of the hard masking layer or oxide layer are ions selected from the group of ions consisting of oxygen and nitrogen; and wherein regions of the hard masking layer and oxide layer that are implanted with ions are etched away at a reduced rate than non-implanted regions.

20. The method of any preceding embodiment, wherein the ion implantation comprises: performing ion implantation at positive tilt angle; and performing ion implantation at negative tilt angle to selectively damage regions of the hard masking layer, wherein regions between photoresist features remain undamaged due to shadowing effects.

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those of ordinary skill in the art.

In the claims, reference to an element in the singular is not intended to mean "one and only one" unless explicitly so stated, but rather "one or more." All structural, chemical, and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

What is claimed is:

1. A method of achieving sub-lithographic feature sizes in an integrated circuit (IC) layer comprising:
   (a) forming an oxide layer on an integrated circuit (IC) layer to be patterned;
   (b) coating a hard masking layer on the oxide layer;
   (c) implanting ions into the hard masking layer overlying the oxide layer with ion implantation;
   (d) etching the hard masking layer with implanted regions to remove regions of the masking layer and form a patterned hard masking layer with sections of exposed oxide layer;
   (e) performing ion implantation to selected sections of the exposed oxide layer through the pattern of the hard masking layer;
   (f) removing the sections of exposed oxide layer; and
   (g) using the patterned hard masking layer and oxide layer as a mask to pattern the integrated circuit layer.

2. The method of claim 1, wherein said hard masking layer is a material selected from the group of materials consisting of amorphous silicon (a-Si), amorphous carbon (a-C), silicon-carbon-oxide, polycrystalline silicon, silicon nitride (SiNx or Si$_3$N$_4$), silicon oxynitride (SiOxNy), and silicon dioxide (SiO$_2$).

3. The method of claim 1, wherein the ion implantation comprises:
   performing ion implantation at positive tilt angle; and
   performing ion implantation at negative tilt angle to selectively damage regions of the hard masking layer, wherein regions between photoresist features remain undamaged due to shadowing effects.

4. The method of claim 1:
   wherein the ions used for ion implantation of the hard masking layer are ions of argon (Ar$^+$); and
   wherein regions of the hard masking layer that are implanted with ions are etched away at an increased rate than non-implanted regions.

5. The method of claim 1:
   wherein the ions used for ion implantation of the hard masking layer are ions selected from the group of ions consisting of oxygen and nitrogen; and
   wherein regions of the hard masking layer that are implanted with ions are etched away at a reduced rate than non-implanted regions.

6. The method of claim 1, further comprising:
   applying a photoresist layer on the hard masking layer;
   printing features in the photoresist layer exposing sections of the hard masking layer with photolithography to produce a patterned photoresist layer;
   implanting ions into portions of the hard masking layer not blocked by the patterned photoresist layer; and
   etching away implanted portions of the hard mask layer.

7. The method of claim 1, further comprising coupling the integrated circuit layer to a base substrate.

8. A method for patterning a semiconductor layer, the method comprising:
   (a) forming an oxide layer on a semiconductor layer to be patterned;
   (b) coating a hard masking layer on the oxide layer;
   (d) etching the hard masking layer to produce a patterned hard masking layer with sections of exposed oxide layer;
   (e) performing ion implantation to selected sections of the exposed oxide layer through the pattern of the patterned hard masking layer;
   (f) removing the sections of exposed implanted oxide layer; and
   (g) patterning the semiconductor layer with the pattern of the oxide layer; and
   (i) wherein implanted regions of the oxide layer etch at a different rate than non-implanted regions of the oxide layer.

9. The method of claim 8, further comprising coupling the semiconductor layer to a base substrate.

10. The method of claim 8:
    wherein the ions used for ion implantation of the oxide layer are ions of argon (Ar$^+$); and
    wherein regions of the oxide layer that are implanted with ions are etched away at an increased rate than non-implanted regions.

11. The method of claim 8:
    wherein the ions used for ion implantation of the oxide layer are ions selected from the group of ions consisting of oxygen and nitrogen; and
    wherein regions of the oxide layer that are implanted with ions are etched away at a reduced rate than non-implanted regions.

12. The method of claim 8, wherein said hard masking layer is a material selected from the group of materials consisting of amorphous silicon (a-Si), amorphous carbon (a-C), silicon-carbon-oxide, SiO$_2$, polycrystalline silicon and d silicon nitride (SiNx or Si$_3$N$_4$).

13. The method of claim 8, further comprising:
applying a photoresist layer on the hard masking layer;
printing features in the photoresist layer exposing sections of the hard masking layer with photolithography to produce a patterned photoresist layer; and
implanting ions into portions of the hard masking layer not blocked by the patterned photoresist layer; and
etching the hard masking layer.

14. A method for patterning integrated circuit layers, the method comprising:
(a) forming an oxide layer on an integrated circuit (IC) layer to be patterned;
(b) applying a hard masking layer over the formed oxide layer;
(c) coating a photoresist layer onto the hard masking layer;
(d) printing features in the photoresist layer exposing regions of the hard masking layer with photolithography;
(e) selectively implanting regions of the exposed hard masking layer with ion implantation;
(f) etching the hard masking layer exposing sections of the oxide layer, wherein portions of the hard mask layer that are implanted by ion implantation are etched away at a different rate than portions that are not implanted;
(g) removing the photoresist layer from the etched hard masking layer;
(h) performing ion implantation to selected sections of the exposed oxide layer that are not blocked by the etched hard masking layer;
(i) etching the oxide layer, wherein portions of the oxide layer that are implanted by ion implantation are etched away at a different rate than portions that are not implanted;
(j) patterning the integrated circuit layer with the pattern of the etched oxide layer; and
(k) selectively removing the hard masking and oxide layers from the patterned integrated circuit layer.

15. The method of claim 14, further comprising coupling the integrated circuit layer to a base substrate.

16. The method of claim 14, wherein said hard masking layer is a material selected from the group of materials consisting of amorphous silicon (a-Si), amorphous carbon (a-C), silicon-carbon-oxide, polycrystalline silicon, silicon nitride (SiNx or Si$_3$N$_4$) and silicon oxynitride (SiOxNy) and said oxide layer is a silicon oxide.

17. The method of claim 14:
wherein the ions used for ion implantation of the hard masking layer or oxide layer are ions of argon (Ar$^+$); and
wherein regions of the hard masking layer and oxide layer that are implanted with ions are etched away at an increased rate than non-implanted regions.

18. The method of claim 14:
wherein the ions used for ion implantation of the hard masking layer or oxide layer are ions selected from the group of ions consisting of oxygen and nitrogen; and
wherein regions of the hard masking layer and oxide layer that are implanted with ions are etched away at a reduced rate than non-implanted regions.

19. The method of claim 14, wherein said ion implantation comprises:
performing ion implantation at positive tilt angle; and
performing ion implantation at negative tilt angle to selectively damage regions of the hard masking layer, wherein regions between photoresist features remain undamaged due to shadowing effects.

* * * * *